(12) United States Patent
Kim

(10) Patent No.: US 8,749,302 B2
(45) Date of Patent: Jun. 10, 2014

(54) SEMICONDUCTOR INTEGRATED CIRCUIT APPARATUS HAVING I/O SIGNAL LINE

(75) Inventor: Sung Ho Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/602,264

(22) Filed: Sep. 3, 2012

(65) Prior Publication Data
US 2013/0234789 A1  Sep. 12, 2013

(30) Foreign Application Priority Data
Dec. 22, 2011  (KR) .................. 10-2011-0140443

(51) Int. Cl.
*H01L 25/00* (2006.01)
(52) U.S. Cl.
USPC ........................................................ 327/565

(58) Field of Classification Search
USPC .......................................... 327/564, 565, 566
See application file for complete search history.

(56) References Cited

U.S. PATENT DOCUMENTS

| | | | |
|---|---|---|---|
| 7,099,174 B2 * | 8/2006 | Thompson et al. | 365/63 |
| 7,161,823 B2 * | 1/2007 | Lee et al. | 365/63 |
| 7,259,978 B2 * | 8/2007 | Park et al. | 365/63 |
| 7,266,037 B2 * | 9/2007 | Mochida | 365/230.03 |
| 2007/0096323 A1 * | 5/2007 | Thompson et al. | 257/758 |

* cited by examiner

*Primary Examiner* — Jeffrey Zweizig
(74) *Attorney, Agent, or Firm* — William Park & Associates Patent Ltd.

(57) ABSTRACT

A semiconductor integrated circuit apparatus includes: a plurality of column select signal lines extended in parallel to each other with a predetermined distance provided therebetween; a local I/O line arranged in a selected space among spaces formed between the respective column select signal lines; and an upper segment I/O line arranged to overlap the local I/O line and a local I/O line bar.

13 Claims, 4 Drawing Sheets

SEMICONDUCTOR INTEGRATED CIRCUIT APPARATUS HAVING I/O SIGNAL LINE

CROSS-REFERENCES TO RELATED APPLICATION

The present application claims priority under 35 U.S.C. §119(a) to Korean application number 10-2011-0140443, filed on Dec. 22, 2011, in the Korean Intellectual Property Office, which is incorporated herein by reference in its entirety.

BACKGROUND

1. Technical Field

The present invention relates to a semiconductor integrated circuit apparatus having an I/O signal line, and more particularly, to a local sense amplifier having an I/O signal line.

2. Related Art

With the increase in integration density of semiconductor integrated circuits, I/O signal lines are hierarchically designed.

For example, DRAM (dynamic random access memory) includes I/O signal lines which are hierarchically divided into global I/O lines GIO, local I/O lines LIO, and segment I/O lines SIO such that signals are transmitted for the respective levels.

A segment I/O line is connected to a bit line to transmit a signal, and is electrically connected to a local I/O line LIO to transmit a signal. Furthermore, the local I/O line LIO is electrically connected to a global I/O line GIO to transmit a signal.

In general, a local sense amplifier includes local I/O lines LIO and segment I/O lines which are alternately arranged with column select signal lines interposed therebetween. Furthermore, an upper local I/O line and an upper segment I/O line are extended to the top portions of the local I/O line and the segment I/O line so as to be secondarily connected to a lower local I/O line and a lower segment I/O line. The upper local I/O line and the upper segment I/O line may be arranged in a direction perpendicular to the lower local I/O line and the lower segment I/O line.

However, as the integration density exponentially increases, the I/O signal lines of the conventional memory apparatus, that is, local I/O lines, segment I/O lines, and column select lines are arranged with a minimum critical dimension (CD) provided therebetween. Since there is a shrinking amount of space to allocate the increasing number of lines, there are difficulties in securing a space for forming a power mesh line.

SUMMARY

In one embodiment of the present invention, a semiconductor integrated circuit apparatus includes: a plurality of column select signal lines extended in parallel to each other with a predetermined distance provided therebetween; a local I/O line arranged in a selected space among spaces formed between the respective column select signal lines; and an upper segment I/O line arranged to overlap the local I/O line and a local I/O line bar.

In another embodiment of the present invention, a semiconductor integrated circuit apparatus includes: a lower segment I/O line and a lower segment I/O line bar extended in parallel to a first direction with a predetermined distance provided therebetween; a plurality of column select signal lines arranged to cross the lower segment I/O line and the lower segment I/O line bar and extended in parallel to each other with a predetermined distance provided therebetween, thereby defining first to fourth spaces; a local I/O line arranged in the first space among the spaces corresponding to the distances between the respective column select signal lines; a local I/O line bar arranged in the second space among the spaces corresponding to the distances between the respective column select signal lines; an upper segment I/O line formed in the first space so as to partially overlap the local I/O line; an upper segment I/O line bar formed in the second space so as to partially overlap the local I/O line; and power mesh lines arranged in the third and fourth spaces, respectively.

In another embodiment of the present invention, a semiconductor integrated circuit apparatus includes: a semiconductor substrate; a lower segment I/O line and a lower segment I/O line bar formed of a first metal layer over the semiconductor substrate and extended in parallel to a first direction with a predetermined distance provided therebetween; a plurality of column select signal lines formed of a second metal layer, arranged to cross the lower segment I/O line and the lower segment I/O line bar, and extended in parallel to each other with a predetermined distance provided therebetween, thereby defining first to fourth spaces; a local I/O line formed of the second metal layer and arranged in the first space among the spaces corresponding to the distances between the respective column select signal lines; a local I/O line bar formed of the second metal layer and arranged in the second space among the spaces corresponding to the distances between the respective column select signal lines; an upper segment I/O line formed of a third metal layer and formed in the first space so as to partially overlap the local I/O line; an upper segment I/O line bar formed of the third metal layer and formed in the second space so as to partially overlap the local I/O line bar; and power mesh lines arranged in the third and fourth spaces, respectively, wherein insulating layer are interposed between the semiconductor substrate and the first metal layer, between the first metal layer and the second metal layer, and between the second metal layer and the third metal layer, respectively.

The semiconductor integrated circuit apparatus may further include a first transmission transistor positioned between the lower segment I/O line and the lower segment I/O line bar and configured to transmit a signal of the upper segment I/O line to the local I/O line; and a second transmission transistor positioned between the lower segment I/O line and the lower segment I/O line bar and configured to transmit a signal of the upper segment I/O line bar to the local I/O line bar.

The lower segment I/O line may be electrically isolated at intersections with the column select signal lines, and electrically connected to the upper segment I/O line.

Each of the column select signal lines may include a pair of unit column select signal lines.

BRIEF DESCRIPTION OF THE DRAWINGS

Features, aspects, and embodiments are described in conjunction with the attached drawings, in which:

FIG. 1 is a plan view of a local sense amplifier of a semiconductor integrated circuit apparatus according to one embodiment of the present invention;

FIG. 2 is a cross-sectional view taken along line II-II' of FIG. 1;

FIG. 3 is a cross-sectional view taken along line III-III' of FIG. 1; and FIG. 4 is a plan view of the local sense amplifier of the semiconductor integrated circuit apparatus, to which power mesh lines are applied, according to the embodiment of the present invention.

DETAILED DESCRIPTION

Hereinafter, a local sense amplifier according to the present invention will be described below with reference to the accompanying drawings through various embodiments.

Figure 1:
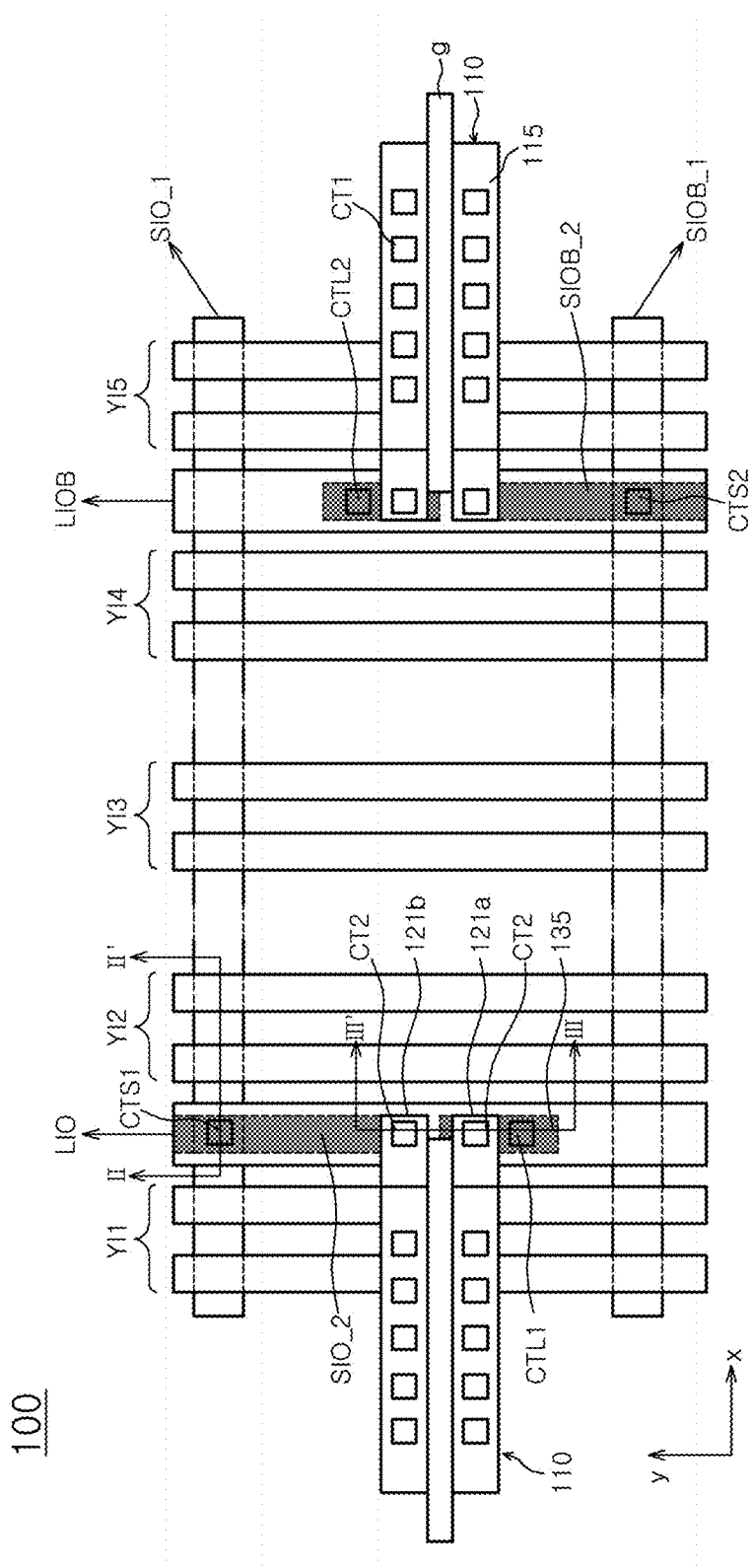

Referring to FIG. 1, a local sense amplifier 100 includes column select signal lines YI1 to YI5, a segment I/O line pair SIO/SIOB, a local I/O line pair LIO/LIOB, and a transmission transistor 110.

The column select signal lines YI1 to YI5 are arranged with a predetermined distance provided therebetween. In this embodiment of the present invention, a column select signal line YI refers to a pair of unit column select signal lines arranged with a predetermined distance provided therebetween, and one column select signal line may refer to a unit column select signal line. Furthermore, each of the column select signal lines YI1 to YI5 may be analyzed as two unit column select signal lines.

The respective column select signal lines YI1 to YI5 are extended in parallel to each other in a y-axis direction of FIG. 1, and the distance provided therebetween may correspond to a space where one conductive line is arranged without signal interference.

In this embodiment of the present invention, the column selective signal lines YI1 to YI5 are referred to as first to fifth column selective signal lines YI1 to YI5 from the left side of FIG. 1, for convenience of description. However, the sequence of the column select signal lines are arbitrarily set for description, and not limited thereto.

The segment I/O line pair SIO/SIOB includes a segment I/O line SIO and a segment I/O line bar SIOB. Depending on arrangement positions, the segment I/O line pair SIO/SIOB may be divided into a lower segment I/O line pair SIO_1/SIOB_1 and an upper segment I/O line pair SIO_2/SIOB_2. The lower segment I/O line pair SIO_1/SIOB_1 includes a lower segment I/O line SIO_1 and a lower segment I/O line bar SIOB_1, and the upper segment SIO_2/SIOB_2 includes an upper segment I/O line SIO_2 and an upper segment I/O line bar SIOB_2.

Here, the lower segment I/O line SIO_1 and the lower segment I/O line bar SIOB_1 may be arranged in parallel so as to be spaced at a predetermined distance from each other, and may be extended in an x-axis direction of FIG. 1 so as to cross the column select signal lines YI1 to YI5. The distance between the lower segment I/O line SIO_1 and the lower segment I/O line bar SIOB_1 may correspond to a space where the transmission transistor 110 is formed. Furthermore, the lower segment I/O line pair SIO_1/SIOB_1 and the column select signal lines YI1 to YI5 may be isolated from each other at intersections therebetween.

The upper segment I/O line SIO_2 is extended in a selected space, for example, a space between the first and second column select signal lines YI1 and YI2 in a direction parallel to the y-axis direction. Here, the upper segment I/O line SIO_2 is contacted with the lower segment I/O line SIO_1 at an intersection therebetween, and has one end extended to the transmission transistor 110 positioned in a space between the lower segment I/O line SIO_1 and the lower segment I/O line bar SIOB_1 so as to be electrically connected to a predetermined portion of the transmission transistor 110.

The upper segment I/O line bar SIOB_2 is extended in a selected space, for example, a space between the fourth and fifth column select signal lines YI4 and YI5 in a direction parallel to the y-axis direction. Here, the upper segment I/O line bar SIOB_2 is contacted with the lower segment I/O line bar SIOB_1 at an intersection therebetween, and has one end extended to the transmission transistor 110 positioned between the lower segment I/O line SIO_1 and the lower segment I/O line bar SIOB_1 so as to be electrically connected to a predetermined portion of the transmission transistor 110. In FIG. 1, CTS1 represents a contact between the lower segment I/O line SIO_1 and the upper segment I/O line SIO_2 (hereafter, referred to as a segment contact), and CTS2 represents a contact between the lower segment I/O line bar SIOB_1 and the upper segment I/O line bar SIOB_2 (hereafter, referred to as a segment bar contact).

The local I/O line LIO is arranged in a space between the first and second column select signal lines YI1 and YI2 so as to overlap the upper segment I/O line SIO_2, and contacted with the upper segment I/O line SIO_2 at a predetermined portion. The local I/O line LIO may be extended in the y-axis direction so as to cross the lower segment I/O line SIO_1 and the lower segment I/O line bar SIOB_1.

The local I/O line bar LIOB is arranged in a space between the fourth and fifth column select signal lines YI4 and YI5 so as to overlap the upper segment I/O line SIOB_1, and contacted with the upper segment I/O line bar SIO_2 at a predetermined portion. The local I/O line bar LIOB may be extended in the y-axis direction so as to cross the lower segment I/O line SIO_1 and the lower segment I/O line bar SIOB_1. In FIG. 1, CTL1 represents a contact between the upper segment I/O line SIO_2 [and the local I/O line LIO (hereafter, referred to as a local contact), and CTL2 represents a contact between the upper segment I/O line bar SIOB_1 and the local I/O line bar LIOB (hereafter, referred to as a local bar contact).

The transmission transistor 110 is an area where a plurality of transistors forming a sense amplifier are formed, and may substantially indicate a transmission transistor area of the sense amplifier. In this embodiment of the present invention, the transmission transistor is represented in a box shape, for convenience of description. However, the transmission transistor is not limited thereto, but may be modified in various manners to reduce an area. In the transistor area 110, reference numeral 115 represents an active area, g represents a gate electrode, a CT1 [represents a source/drain contact, CT2 represents source/drain interconnections, and 125a and 125b represent metal contacts connected to the source/drain interconnections 121a and 121b.

In this embodiment of the present invention, the upper segment I/O line pair SIO_2/SIOB_2, which has been independently arranged between the column select signal lines YI in the existing structure, is arranged over the local I/O line pair LIO/LIOB so as to overlap each other. Accordingly, the area where the upper segment I/O line pair SIO_2/SIOB_2 has been arranged in the existing structure may be utilized as a spare area.

Hereafter, referring to FIGS. 2 and 3, the cross-sectional structure of the local sense amplifier in accordance with the embodiment of the present invention will be described in more detail.

Figure 2:
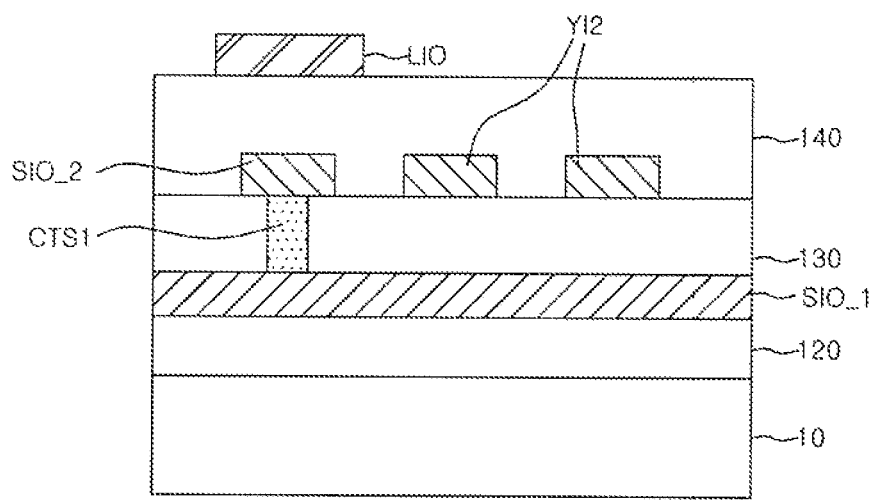

FIG. 2 is a cross-sectional view taken along line II-IF of FIG. 1. Referring to FIG. 2, a first interlayer dielectric layer 120 is formed over a semiconductor substrate 10. Although not illustrated, a transistor area 110 forming a sense amplifier may be arranged between the semiconductor substrate 10 and the first interlayer dielectric layer 120.

The lower segment I/O line SIO_1 is formed of a first metal layer over the first interlayer dielectric layer 120. A second interlayer dielectric layer 130 is formed on the lower segment I/O line SIO_1, and the segment contact CTS1 is formed in the second interlayer dielectric layer 130 so as to be electrically connected to the lower segment I/O line SIO_1. A second metal layer is formed over the second interlayer dielectric layer 130 having the segment contact CTS1 formed therein, and then patterned to form the upper segment I/O line SIO_2 and the column select signal line YI2 which are electrically connected to the segment contact CTS1. A third interlayer dielectric layer 140 is formed on the upper segment I/O line SIO_2 and the column select signal line YI2, and the local I/O line LIO is formed of a third metal layer over the third interlayer dielectric layer 140 so as to overlap the upper segment I/O line SIO_2.

Figure 3:
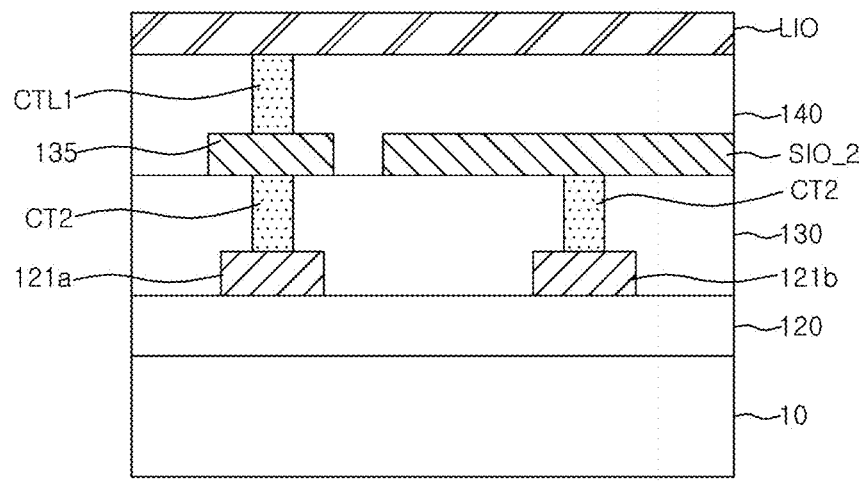

FIG. 3 is a cross-sectional view taken along line III-III' of FIG. 1. Referring to FIG. 3, the first interlayer dielectric layer 120 is formed over the semiconductor substrate 10, as described above.

The first metal interconnections 121a and 121b are formed of the first metal layer forming the lower segment I/O line SIO_1 over the first interlayer dielectric layer 120. The first metal interconnections 121a and 121b are electrically connected to the source and drain of the transistor area 110 (refer to FIG. 1), respectively.

The second interlayer dielectric layer 130 is formed over the first metal interconnections 121a and 121b, and the second contacts CT2 are formed in the second interlayer dielectric layer 130 so as to be electrically connected to the first metal interconnections 121a and 121b, respectively.

The upper segment I/O line SIO_2 and a contact pad 135 are formed of the second metal layer over the second interlayer dielectric layer 130 having the second contacts CT2 formed therein. The upper segment I/O line SIO_2 is connected to the second contact CT2 which is electrically connected to a source or drain, and the contact pad 135 is connected to the second contact CT2 which is electrically connected to a drain or source. The third interlayer dielectric layer 140 is formed over the upper segment I/O line SIO_2 and the contact pad 135, a local contact CTL1 is formed in the third interlayer dielectric layer 140, and the local I/O line LIO is formed of the third metal layer over the third interlayer dielectric layer 140 so as to overlap the upper segment I/O line SIO_2.

As the local I/O line LIO and the local I/O line bar LIOB are arranged to overlap the segment I/O line SIO and the segment I/O line bar SIOB, respectively, the area where the local I/O line LIO and the local I/O line bar LIOB have been arranged in the existing structure may be utilized as a spare space.

Figure 4:
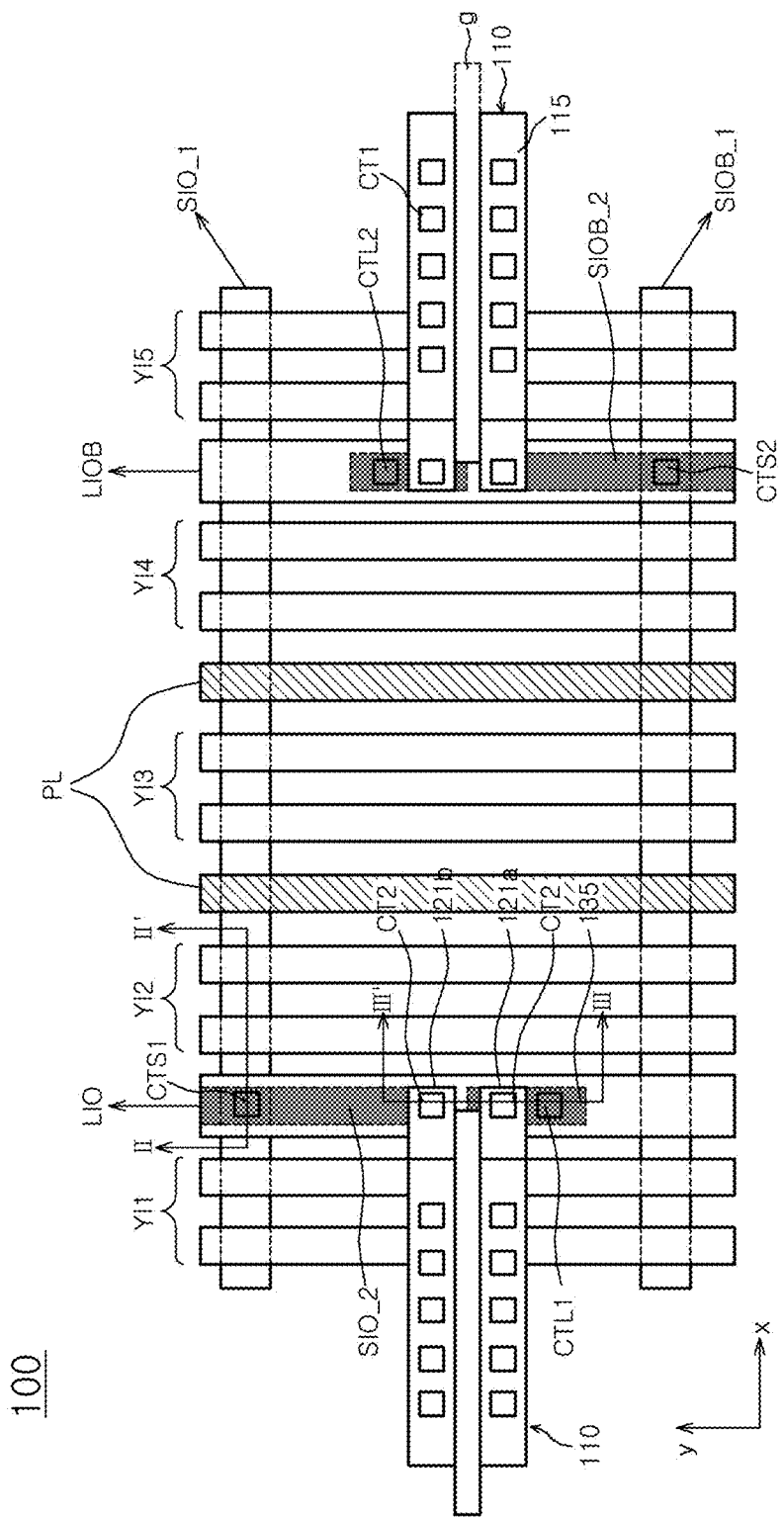

Accordingly, referring to FIG. 4, power mesh lines PL may be formed in the spare space. As the power mesh lines PL are arranged in the spare space, it is possible to provide a uniform voltage to the respective power lines.

According to the embodiment of the present invention, the local I/O line pair is arranged to overlap a predetermined portion of the segment I/O line pair such that the area of the local I/O line pair is secured as a spare space. Therefore, as the power mesh lines are arranged in the secured spare space, it is possible to significantly improve the power mesh characteristic of the semiconductor integrated circuit apparatus.

The present invention is not limited to the above-described embodiment.

In this embodiment of the present invention, a cell array structure was omitted. However, cell arrays may be positioned over and under the column select signal lines of FIGS. 1 and 4.

Furthermore, the transmission transistor 110 was taken as an example for description. However, the transmission transistor 110 is a kind of switch for transmitting a signal, and is not limited to a transistor. That is, all kinds of I/O switches may be applied.

Furthermore, the local sense amplifier was taken as an example for description. However, the present invention may be applied the same to a general I/O sense amplifier.

While certain embodiments have been described above, it will be understood to those skilled in the art that the embodiments described are by way of example only. Accordingly, the semiconductor integrated circuit apparatus described herein should not be limited based on the described embodiments. Rather, the semiconductor integrated circuit apparatus described herein should only be limited in light of the claims that follow when taken in conjunction with the above description and accompanying drawings.

What is claimed is:

1. A semiconductor integrated circuit apparatus comprising:
a plurality of column select signal lines extended in parallel to each other with a predetermined distance provided therebetween;
an upper segment I/O line arranged in a selected space among spaces formed between the respective column select signal lines; and
a local I/O line arranged to overlap the upper segment I/O line, and disposed over the upper segment I/O line,
wherein the plurality of column select signal lines, the upper segment I/O line, and the local I/O line are extended in the same direction.

2. The semiconductor integrated circuit apparatus according to claim 1, further comprising a power mesh line arranged in a space where the upper segment I/O line is not arranged, among the spaces formed between the respective column select signal lines.

3. The semiconductor integrated circuit apparatus according to claim 1, further comprising a transmission transistor configured to transmit a signal of the upper segment I/O line to the local I/O line.

4. The semiconductor integrated circuit apparatus according to claim 3, further comprising a lower segment I/O line arranged to cross the column select signal lines,
wherein the lower segment I/O line is electrically isolated at intersections with the column select signal lines, and electrically connected to the upper segment I/O line.

5. The semiconductor integrated circuit apparatus according to claim 1, wherein each of the column select signal lines comprises a pair of unit column select signal lines.

6. A semiconductor integrated circuit apparatus comprising:
a lower segment I/O line and a lower segment I/O line bar extended in parallel to a first direction with a predetermined distance provided therebetween;
a plurality of column select signal lines arranged to cross the lower segment I/O line and the lower segment I/O line bar and extended in parallel to each other with a predetermined distance provided therebetween, thereby defining first to fourth spaces;
an upper segment I/O line arranged in the first space among the spaces corresponding to the distances between the respective column select signal lines;
an upper segment I/O line bar arranged in the second space among the spaces corresponding to the distances between the respective column select signal lines;
a local I/O line formed in the first space so as to partially overlap the upper segment I/O line;
a local I/O line bar formed in the second space so as to partially overlap the upper segment I/O line bar; and
power mesh lines arranged in the third and fourth spaces, respectively.

7. The semiconductor integrated circuit apparatus according to claim 6, further comprising:
- a first transmission transistor positioned between the lower segment I/O line and the lower segment I/O line bar and configured to transmit a signal of the upper segment I/O line to the local I/O line; and
- a second transmission transistor positioned between the lower segment I/O line and the lower segment I/O line bar and configured to transmit a signal of the upper segment I/O line bar to the local I/O line bar.

8. The semiconductor integrated circuit apparatus according to claim 6, wherein the lower segment I/O line is electrically isolated at intersections with the column select signal lines, and electrically connected to the upper segment I/O line.

9. The semiconductor integrated circuit apparatus according to claim 6, wherein each of the column select signal lines comprises a pair of unit column select signal lines.

10. A semiconductor integrated circuit apparatus comprising:
- a semiconductor substrate;
- a lower segment I/O line and a lower segment I/O line bar formed of a first metal layer over the semiconductor substrate and extended in parallel to a first direction with a predetermined distance provided therebetween;
- a plurality of column select signal lines formed of a second metal layer, arranged to cross the lower segment I/O line and the lower segment I/O line bar, and extended in parallel to each other with a predetermined distance provided therebetween, thereby defining first to fourth spaces;
- an upper segment I/O line formed of the second metal layer and arranged in the first space among the spaces corresponding to the distances between the respective column select signal lines;
- an upper segment I/O line bar formed of the second metal layer and arranged in the second space among the spaces corresponding to the distances between the respective column select signal lines;
- a local I/O line formed of a third metal layer and formed in the first space so as to partially overlap the upper segment I/O line;
- a local I/O line bar formed of the third metal layer and formed in the second space so as to partially overlap the upper segment I/O line bar; and
- power mesh lines arranged in the third and fourth spaces, respectively,
- wherein insulating layers are interposed between the semiconductor substrate and the first metal layer, between the first metal layer and the second metal layer, and between the second metal layer and the third metal layer, respectively.

11. The semiconductor integrated circuit apparatus according to claim 10, further comprising:
- a first transmission transistor positioned between the lower segment I/O line and the lower segment I/O line bar and configured to transmit a signal of the upper segment I/O line to the local I/O line; and
- a second transmission transistor positioned between the lower segment I/O line and the lower segment I/O line bar and configured to transmit a signal of the upper segment I/O line bar to the local I/O line bar.

12. The semiconductor integrated circuit apparatus according to claim 10, wherein the lower segment I/O line is electrically isolated at intersections with the column select signal lines, and electrically connected to the upper segment I/O line.

13. The semiconductor integrated circuit apparatus according to claim 10, wherein each of the column select signal lines comprises a pair of unit column select signal lines.

* * * * *